(12) United States Patent  
McCall et al.

(10) Patent No.: US 9,152,257 B2  
(45) Date of Patent: Oct. 6, 2015

(54) LOW SWING VOLTAGE MODE DRIVER

(71) Applicant: Intel Corporation, Santa Clara, CA (US)

(72) Inventors: James A. McCall, Portland, OR (US); Kuljit S. Bains, Olympia, WA (US); Derek M. Conrow, Sherwood, OR (US); Aaron Martin, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 327 days.

(21) Appl. No.: 13/730,642

(22) Filed: Dec. 28, 2012

(65) Prior Publication Data

US 2014/0184523 A1    Jul. 3, 2014

(51) Int. Cl.
*H03K 3/012* (2006.01)
*G06F 3/041* (2006.01)
*H03K 19/00* (2006.01)
*H03K 19/0175* (2006.01)

(52) U.S. Cl.
CPC ............ *G06F 3/041* (2013.01); *H03K 19/0005* (2013.01); *H03K 19/017545* (2013.01)

(58) Field of Classification Search
USPC ......... 327/108–109, 112, 170–172, 376–377, 327/379, 436–437; 326/81–87
See application file for complete search history.

(56) References Cited

U.S. PATENT DOCUMENTS

| | | | |
|---|---|---|---|
| 6,300,806 B1 * | 10/2001 | Theus et al. | 327/112 |
| 6,320,433 B1 * | 11/2001 | Hinterscher | 327/112 |
| 6,573,753 B1 * | 6/2003 | Snyder | 326/87 |
| 6,631,083 B2 | 10/2003 | McCall et al. | |
| 6,674,648 B2 | 1/2004 | McCall et al. | |
| 6,674,649 B2 | 1/2004 | McCall et al. | |
| 6,686,762 B2 | 2/2004 | Leddige et al. | |
| 6,700,457 B2 | 3/2004 | McCall | |
| 6,711,027 B2 | 3/2004 | McCall et al. | |
| 6,711,640 B1 | 3/2004 | Leddige et al. | |
| 6,724,082 B2 | 4/2004 | McCall et al. | |
| 6,747,483 B2 | 6/2004 | To et al. | |
| 6,771,515 B2 | 8/2004 | McCall et al. | |
| 6,894,547 B2 * | 5/2005 | Takahashi | 327/170 |
| 6,918,078 B2 | 7/2005 | McCall et al. | |

(Continued)

OTHER PUBLICATIONS

PCT International Search Report and Written Opinion of the International Searching Authority for Int'l Application No. PCT/US2013/046897, dated Oct. 8, 2013, 13 pages.

(Continued)

*Primary Examiner* — An Luu
(74) *Attorney, Agent, or Firm* — Blakely, Sokoloff, Taylor & Zafman LLP

(57) ABSTRACT

An output driver includes control logic configured to switch on a pull-up circuit and a pull-down circuit to provide an output impedance for a logic low on a transmission line. The output driver includes a variable pull-up resistor. The control logic is configured to switch on the pull-up circuit to a first value of impedance to drive a logic high on the transmission line. The control logic is configured to switch on the pull-up circuit to a second value of impedance and to switch on the pull-down circuit to provide the output impedance to drive a logic low on the transmission line. The system could alternatively be configured for the inverse to switch on a combination of pull-up and pull-down circuits for a logic high, where the pull-down circuit is switched on for a logic low.

23 Claims, 8 Drawing Sheets

(56) References Cited

U.S. PATENT DOCUMENTS

| | | | |
|---|---|---|---|
| 7,010,637 B2 | 3/2006 | To et al. | |
| 7,719,307 B2 * | 5/2010 | Lee | 326/30 |
| 7,893,710 B2 * | 2/2011 | Lee | 326/30 |
| 8,274,308 B2 | 9/2012 | McCall et al. | |
| 2003/0067327 A1 | 4/2003 | Borkenhagen et al. | |
| 2010/0164544 A1 | 7/2010 | Song | |
| 2011/0141829 A1 | 6/2011 | Ware | |
| 2012/0092057 A1 | 4/2012 | Yu | |

OTHER PUBLICATIONS

Heesoo Song et al., "A Reduced-Swing Voltage-Mode Driver for Low-Power Multi-Gb/s Transmitters", Journal of Semiconductor Technology and Science, vol. 9, No. 2, Jun. 2009, pp. 104-109.

* cited by examiner

LOW SWING VOLTAGE MODE DRIVER

FIELD

Embodiments of the invention are generally related to device interconnection, and more particularly to lower power interconnection via a low swing voltage mode driver.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2012, Intel Corporation, All Rights Reserved.

BACKGROUND

There continues to be an increasing demand for computing devices, and a demand for increased performance of the computing devices. While there is demand for higher-performance devices, there is also a great demand for lower-power devices. In low-power devices, the interaction among components on the device consumes much of the device power. The interaction among components can generally be referred to as I/O (input/output), where components exchange information.

Most active power in component I/O is used by the output driver. Systems currently have a very limited ability to adjust the power consumption of the I/O circuits. Typically, I/O circuits use a fixed voltage swing whose value is based on a worst-case setting. Even assuming there was a better option setting that could use lower power in a particular device, there are currently limited options available to adjust the I/O power settings. Furthermore, it will be understood that changing I/O settings to reduce power consumption can result in inefficiencies manifesting themselves in other ways that can offset the gains obtained by changing the settings.

One issue encountered by current efforts to reduce I/O power use is that the voltage swing and driver output impedance (Ron) are not independent of each other. Thus, current efforts to adjust Ron (either statically or dynamically) to reduce I/O power result in signal integrity degradation, which means that the memory I/O power can be reduced, but more power is used in other system components to counter the loss of signal integrity. The overall system perspective is minimal to no power reduction by adjusting Ron.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
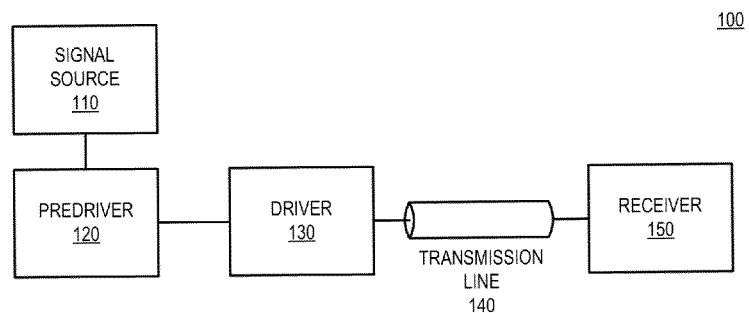
FIG. 1 is a block diagram of an embodiment of a system that sets a driver different for a logic high and a logic low.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, an output driver includes control logic configured to switch on a pull-up circuit and a pull-down circuit to provide an output impedance for a logic low on a transmission line. The output driver includes a variable pull-up resistor. The control logic is configured to switch on the pull-up circuit to a first value of impedance to drive a logic high on the transmission line. The control logic is configured to switch on the pull-up circuit to a second value of impedance and to switch on the pull-down circuit to provide the output impedance to drive a logic low on the transmission line. The different values of output impedance reduce the power consumption by the output driver. Changing the output impedance dynamically also reduces signal integrity distortion, resulting in power savings without loss of signal integrity. Those of skill in the art will understand that the system could be alternatively configured to switch on a pull-up circuit and a pull-down circuit to provide an output impedance for a logic high on the transmission line, where only the pull-down circuit is switched on for a logic low.

A memory interface of a computing system involves I/O between the memory device and a memory controller or other component of the host platform on which the memory device is mounted. Both the memory device and the component with which the memory device exchanges data will have output drivers to drive the signal lines connecting the devices. The output driver impedance control described herein can be used by either the memory device, or the host platform component(s), or both. In one embodiment, the memory device is a DRAM (dynamic random access memory). The interface described herein can be used with memory interfaces including DDRx implementations (e.g., DDR4 (dual data rate version 4), LPDDR4 (low power dual data rate version 4), GDDR5 (graphics dual data rate version 5)), WIDEIO, and SXP (simple extensible pipeline, which has I/O conventions similar to DDR4), each of which has a specification in development as of the filing of this application.

The memory interfaces mentioned above use single-ended voltage mode based drivers. The traditional driver design is to have a pullup (Pu) and pulldown (Pd) that together form output impedance Ron that is the same for outputting a logic high and for outputting a logic low. Thus, the traditional driver design links voltage swing and Ron, which also means that the signal integrity eye width and eye height (see FIGS. 5A and 5B) are also linked. However, as described herein, a different Ron is used for logic high and logic low.

While there can be different ways to implement a variable output impedance, one common approach is to include multiple output driver legs, segments, or portions (for simplicity, the expression "legs" is used herein). Each leg typically includes a transistor or switch, and a resistor. The output resistance or impedance is set by determining how many legs to switch on. In one embodiment, the output driver is configured to operate with a ratio of pull-up legs and pull-down legs operating at the same time. If the total number of legs sets the output impedance, the ratio of pull-up and pull-down can adjust voltage swing. Predriver logic controls the switching on of the pull-up and/or pull-down legs. The ratio of pull-up and pull-down legs can be applied for either a logic low or a logic high, depending on the configuration of the system. The other logic value would be driven conventionally with only the pull-up or pull-down circuit. The following figures and descriptions specifically use as an example a system configured to drive a logic high with only the pull-up circuit, and to switch on a combination of the pull-up and pull-down circuits for a logic low. Those of skill in the art will understand how to configure a system for the inverse: to drive a logic low with only the pull-down circuit, and to switch on a combination of the pull-up and pull-down circuits for a logic high.

FIG. 1 is a block diagram of an embodiment of a system that sets a driver different for a logic high and a logic low. System 100 is an I/O interface or interconnection system. While system 100 does not illustrate specific components to which the transmitter and receiver belong, it will be understood that the interfacing components are connected on either side of transmission line 140. Transmission line 140 represents a trace or wire or other physical medium providing electrical connection between driver 130 and receiver 150. In one embodiment, for purposes of output impedance, the bond wires, pads, pins, bumps, and/or other interconnection media could be considered part of transmission line 140. It will be understood that transmission line 140 can be a bidirectional line, and the role of receiver and driver can switch as the components exchange signals back and forth.

Receiver 150 is part of the device receiving a transmission. Driver 130 represents a transmitter, which is part of a device that sends the transmission to receiver 150. Driver 130 drives transmission line 140 with the output signal. On the transmitter side, predriver 120 configures driver 130 and prepares the output signal for transmission. Signal source 110 can be part of the same component of which driver 130 is a part, or it can be external to the component of which driver 130 is a part. Signal source 110 is typically an application or a process that executes on a processor or logic of a component. In one embodiment, the transmitter is a memory controller and the receiver is a memory device. In one embodiment, the transmitter is the memory device and the memory controller is the receiver.

Driver 130 includes a variable pull-up resistor to pull up transmission line 140 to a first impedance value to drive a logic high, and to a second, different impedance value to drive a logic low. The following descriptions include more details about embodiments of pull-up and pull-down circuits that can be included in driver 130.

Figure 2:
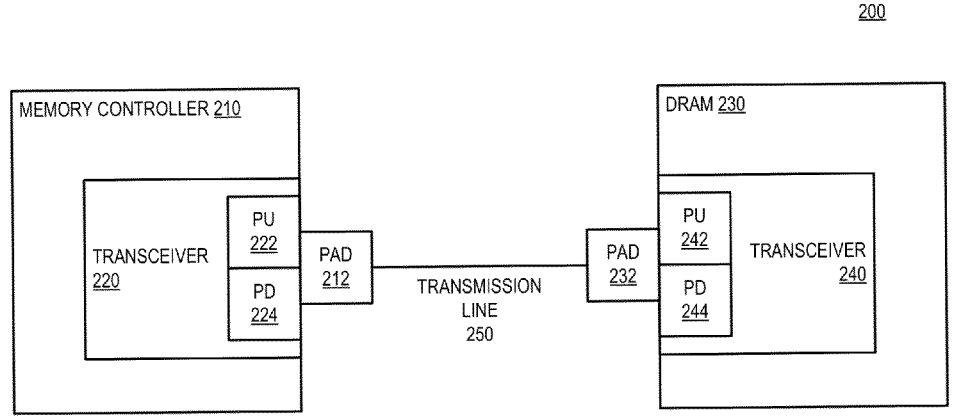
FIG. 2 is a block diagram of an embodiment of a system that uses one pull-up configuration for outputting a logic high and a different pull-up configuration for outputting a logic low.

FIG. 2 is a block diagram of an embodiment of a system that uses one pull-up configuration for outputting a logic high and a different pull-up configuration for outputting a logic low. System 200 is one example of an interface system in accordance with system 100 of FIG. 1. Specifically, memory controller 210 is coupled to DRAM 230 via one or more transmission lines 250. In one embodiment, memory controller 210 and DRAM 230 are coupled to pads 212 and 232, respectively, referring to interconnection mechanisms on a substrate of system 200. Typically, there will be a single pad per device per transmission line 250.

Memory controller 210 includes transceiver 220, which represents transmit (TX) and receive (RX) circuitry. Similarly, DRAM 230 includes transceiver 240, which represents TX and RX circuitry on the DRAM side. In one embodiment, the TX and RX circuits share connections to the same pads (212 and 232), and are configured differently for transmit or receive operations. Thus, transceiver 220 includes PU (pull-up circuitry) 222 and PD (pull-down circuitry) 224. Transceiver 240 includes PU 242 and PD 244.

DRAM can refer to any type of memory device, such as a memory device that is part of a DIMM (dual inline memory module) or other memory module, a memory device directly coupled to a motherboard, a 3DS (three-dimensional stacking) device, hybrid memory cube (HMC), or other memory device. Memory controller can be a standalone device, part of a supporting "chipset" or hardware logic that provides an infrastructure for power and interface logic for a hardware platform of system 200, or part of a host processor (not shown) of system 200.

PU 222 and PU 242 include a variable pull-up resistor to pull up transmission line 250. PD 224 and PD 244 include a pull-down resistor to pull down transmission line 250. While not specifically shown in system 200, each transceiver 220 and 240 include driver control logic coupled to the respective PU and PD circuits. For purposes of example, consider that memory controller 210 drives transmission line 250 to send a signal to DRAM 230. The control logic of transceiver 220 can be configured to switch on PU 222 to a first value of impedance to drive a logic high on transmission line 250. To drive a logic low, the control logic can be configured to switch on PU 222 to a second value of impedance and switch on PD 224. The second value of impedance of PU 222 in parallel with the impedance of PD 224 provides an effective output impedance transceiver 220 as a driver of transmission line 250 when driving the logic low. When DRAM 230 drives transmission line 250, the same description can apply to transceiver 240, PU 242, and PD 244.

Figure 3A:
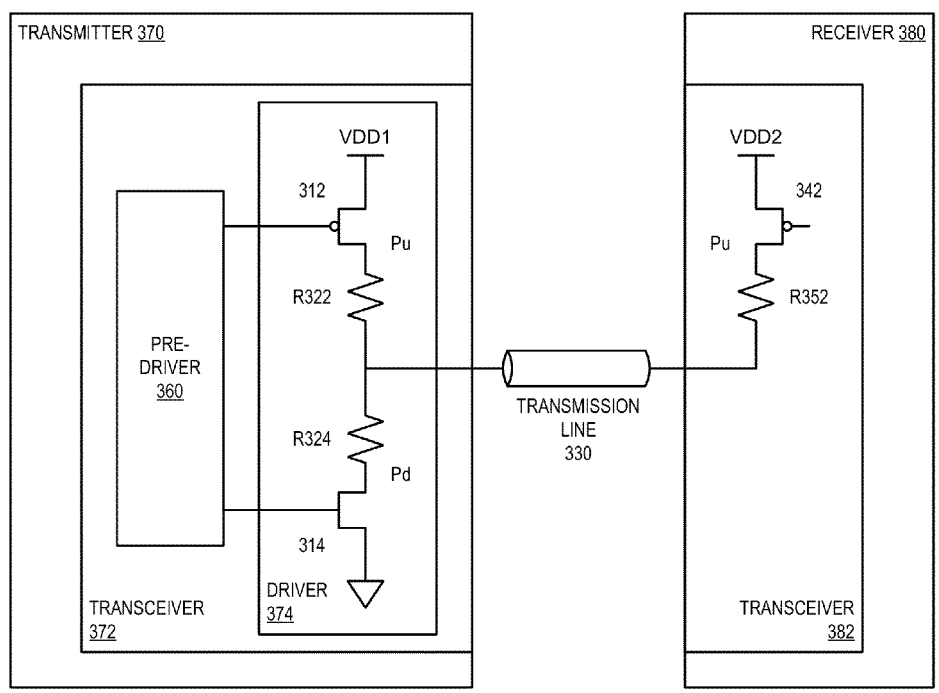
FIG. 3A is a block diagram of an embodiment of an I/O system with a variable output impedance configuration.

FIG. 3A is a block diagram of an embodiment of an I/O system with a variable output impedance configuration. System 300 provides a simplified circuit-equivalent view of the I/O interface between the transmitting device or component and the receiving device or component. Transmitter device 370 includes transceiver 372, which drives transmission line 330. Receiver device 380 includes transceiver 382, which receives the signal driven by transceiver 372.

Transceiver 372 includes driver 374 and predriver 360. Predriver 360 performs preprocessing on a signal to transmit, including preparing driver 374 to drive the signal over transmission line 330. In one embodiment, predriver 360 includes equalization logic (e.g., pre-emphasis equalization, or pre-equalization) otherwise used to provide signal equalization for a transmit signal, which can be used to configure driver 374 with different output impedances.

Driver 374 includes pull-up circuit TX_Pu, which includes switch 312 and resistor R322. Driver 374 also includes pull-down circuit TX_Pd, which includes switch 314 and resistor R324. R322 is a variable resistor. In one embodiment, both TX_Pu and TX_Pd are implemented with multiple legs, as discussed in more detail below with respect to FIGS. 6A and 6B. Transmission line 330 is connected between R322 and R324. R322 connects between transmission line 330 and the drain or output terminal of switch 312 (a p-type transistor). The source or reference terminal of switch 312 is coupled to VDD1, which is a high-voltage reference for transmitter 370. Predriver 360 controls the gate or control terminal of switch 312. R324 connects between transmission line 330 and the drain or output terminal of switch 314 (an n-type transistor). The source or reference terminal of switch 314 is coupled to a ground or low-voltage reference for transmitter 370. Predriver 360 controls the gate or control terminal of switch 314.

Transceiver 382 includes pull-up circuit RX_Pu, which includes switch 342 and resistor R352. R352 is coupled between transmission line 330 and the drain or output terminal of switch 342 (a p-type transistor). The source or reference terminal of switch 342 is coupled to VDD2, which is a high-voltage reference for receiver 380. Transceiver 372 includes driver and/or predriver logic and/or other control logic to control the gate or control terminal of switch 342.

Figure 3B:
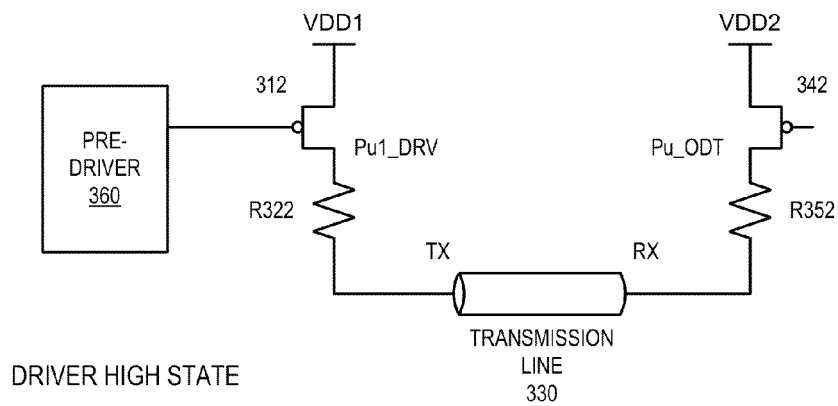
FIG. 3B is a block diagram of an embodiment of an I/O system equivalent for outputting a logic high.

FIG. 3B is a block diagram of an embodiment of an I/O system equivalent for outputting a logic high. System 304 represents system 300 in a configuration for a driver high state. It will be understood that the transmitter, receiver, and their respective transceiver circuits are removed for simplicity in description; the simple labels 'TX' and 'RX' are used in their place. The components of system 304 are described generally with respect to system 300 of FIG. 3A.

Specifically referring to driving a logic high, TX_Pu is configured by predriver 360 to become Pu1_DRV, and TX_Pd is switched off. The driver high state is consistent with traditional or conventional implementations. Of particular note is that predriver 360 or equivalent logic configures Pu1_DRV to a value of impedance that is different for driver high state than for the driver low state illustrated by system 306 described below with respect to FIG. 3C.

It will be understood that Ron or the output impedance as seen from transmission line 330 is equal to Rpu=Rpu1_drv, or the impedance of Pu1_DRV. Rpu1_drv is commonly set to a value in the range of 50 Ohm (possibly in the range of 30 Ohm-60 Ohm). Thus, the Rout_tx_effective_1=Rpu1_drv=50 Ohm.

Figure 3C:
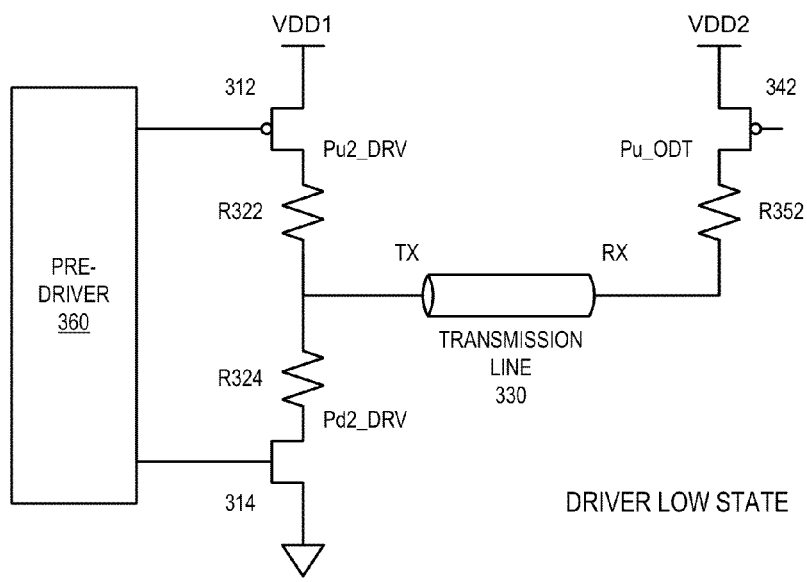
FIG. 3C is a block diagram of an embodiment of an I/O system equivalent for outputting a logic low.

FIG. 3C is a block diagram of an embodiment of an I/O system equivalent for outputting a logic low. System 306 represents system 300 in a configuration for a driver low state. It will be understood that the transmitter, receiver, and their respective transceiver circuits are removed for simplicity in description; the simple labels 'TX' and 'RX' are used in their place. The components of system 306 are described generally with respect to system 300 of FIG. 3A.

Specifically referring to driving a logic low, TX_Pu is configured to become Pu2_DRV, and TX_Pd is configured to become Pd2_DRV. Predriver 360 configures Pu2_DRV and Pu2_DRV to use a lower voltage swing, while maintaining an Ron value (the output impedance seen looking into the transmit side from transmission line 330) consistent across high and low states. The driver high state is illustrated in FIG. 3B, described above, and is a conventional driver high state configuration.

In one embodiment, in a driver low state, predriver 360 configures a ratio of transmit PU (Pu2_DRV) and transmit PD (Pu2_DRV) to adjust the voltage low level and maintain the output impedance. It will be understood that adjusting the voltage low level can refer to raising the low level to reduce the swing, which saves power. Such an implementation can be referred to as normalizing the swing to the high voltage reference or terminating on the upper rail. It will be understood that the same approach could be configured to normalize toward the low-voltage reference (e.g., keeping the same low-voltage driver configuration and configuring the driver to lower the logic high and reduce the swing). Both implementations can be accomplished by using a ratio of Pu to Pd while driving either the low state or the high state, and not using a ratio in the other state.

Consider an example with the following conditions. The high voltage output is equal to the upper rail (Voh=VDD). The low voltage output is controlled by a ratio of the impedances of Pu2_DRV and Pd2_DRV to a level greater than the low voltage reference. Such a condition can be described mathematically as (Vol=VDD*Rpd2_DRV/(Rpd2_drv+(Rpu2_drv//Rpu_odt)), where Rpd2_drv is the impedance value of Pu2_DRV, Rpd2_drv is the impedance value of Pd2_DRV, and Rpu_odt is the value of impedance of Pu_ODT (on-die termination setting for the receiver). Thus, the low voltage level is a ratio of the impedance of Pd2_DRV divided by the sum of the impedance Pd2_DRV and the equivalent impedance of Pu2_DRV in parallel with Pu_ODT. The low power output is computed based on the ratio of Pu2_DRV and Pd2_DRV, and can be expressed as Power 1=VDD^2/(Rpd2_drv+(Rpu2_drv//Rpu_odt)). High power output is zero, and the average power can be expressed as Power_avg=((Power_h+Power_1)/2)=Power_1/2. The output impedance as seen from transmission line 330 can be expressed as Rout_tx_effective=Rpu_drv=(Rpu2_drv//Rpd2_drv), or the transmit pull-up impedance in parallel with the transmit pull-down impedance.

To further provide example values, assuming VDD1=1V, Rpd2_drv=100 Ohm, Rpu2_drv=100 Ohm, and Rpu_odt=50 Ohm (and assuming Rpu1_drv=50 Ohm from above). With those values, Voh=1V, Vol=0.75V, Power_h=0, Power_1=1V/(100+33) Ohm=7.5 mW, Power_avg=3.75 mW, and Rout_tx_effective_1=100 Ohm//100 Ohm=50 Ohm. As shown above with respect to FIG. 3B, Rout_tx_effective_h is also equal to 50 Ohm.

Contrast such a configuration to a typical configuration, which can be expressed as follows. Voh=VDD, Vol=VDD*Rpd_drv/(Rpd_drv+Rpu_odt), Power_h=0, Power_1=VDD^2/((Rpd_drv+Rpu_odt), Power_avg=(Power_h+Power_1)/2, and Rout_tx_effective=Rpu_drv=Rpd_drv. Assuming typical values as VDD=1V, Rpd_drv=Rpu_drv=50, Rpu_odt=50, then Voh=1V, Vol=0.5V, Power_h=0, Power 1=1/100=10 mW, Power_avg=5 mW, and Rout_tx_effective=50 Ohm.

Thus, it will be understood that the described configuration with the impedance of Pu being different for logic high and logic low, the effective output impedance is still consistent at 50 Ohm for the assumed case. However, for the assumed case, the power savings is 1.25 mW, which is 25% savings over the conventional configuration.

It will be understood that the descriptions of FIGS. 3B and 3C could essentially be reversed for an embodiment of a system configured to drive a logic high with both the pull-up and pull-down circuits, and drive a logic low with the pull-down circuit. It will be understood that the system described in FIGS. 3B and 3C can be referred to as a VDD terminated system. The reversing of the descriptions would apply to a VSS (or GND) terminated system.

Figure 4:
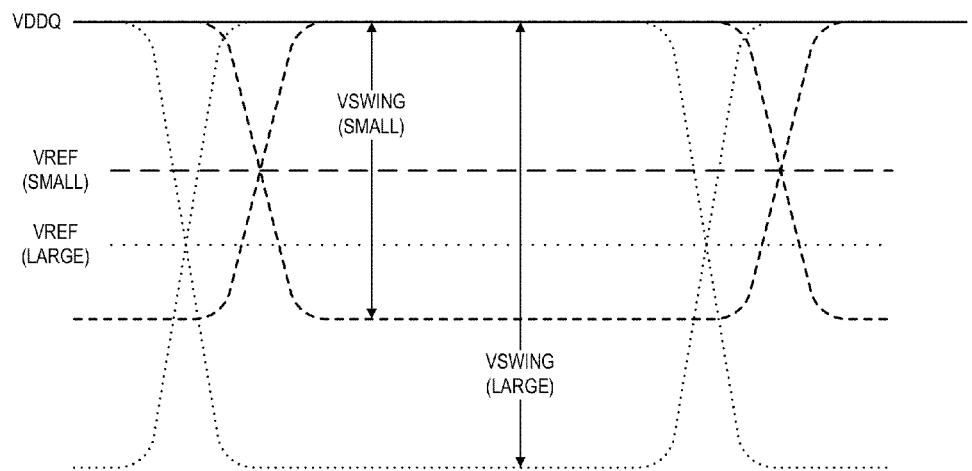
FIG. 4 is an embodiment of a curve illustrating output voltage swing.

FIG. 4 is an embodiment of a curve illustrating output voltage swing. Vswing_large represents a traditional implementation of a low output from a driver, such as the example given above. Vswing_small shows a reduced swing in accordance with any embodiment described herein. A specific example is given above with respect to FIG. 3C. It will be understood that the example provided is for a VDDQ termination example (e.g., as with DDR4 or SXP). In one embodiment, the driver includes reference voltage logic that enables the system to adjust the center voltage reference value (Vref). Thus, Vref_small is shown closer to VDDQ to reduce Vswing.

Figure 5A:
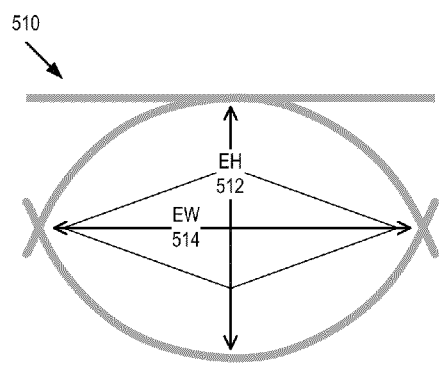
FIG. 5A is a block diagram of an embodiment of a signal eye with large margins.

FIG. 5A is a block diagram of an embodiment of a signal eye with large margins. Curve or signal eye 510 illustrates one example of a signal eye, referring to an output signal characteristic. EH (eye height) 512 can be understood as a margin for the voltage domain. Thus, for example, voltage swing would generally be understood to affect EH 512. EW (eye width) 514 can be understood as a margin for the timing domain. Thus, parameters affecting timing of the I/O circuit system would generally be understood to affect EW 514. As described herein, the output voltage swing can be reduced and less power used, taking advantage of the large margin for EH 512. It is common for a system to be limited by either eye width or eye height. The diamond with signal eye 510 represents a pass/fail mask for the output signal. Signal eye 510 has very little margin with respect to EW 514, but significant margin with respect to EH 512. Thus, the voltage swing can be reduced as shown in FIG. 5B.

Figure 5B:
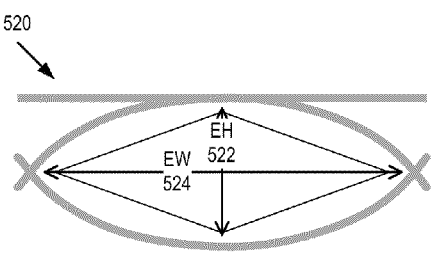
FIG. 5B is a block diagram of an embodiment of a signal eye with reduced margins.

FIG. 5B is a block diagram of an embodiment of a signal eye with reduced margins. Specifically, the margin with respect to eye height has been reduced without affecting the margin with respect to eye width by reducing the voltage swing for low voltage output. Thus, EW 524 of signal eye 520 is comparable or the same as EW 514 of signal eye 510, and the timing of the output is maintained. However, EH 522 is much lower than EH 512, and so reduces the margin around the pass/fail mask diamond.

Figure 6A:
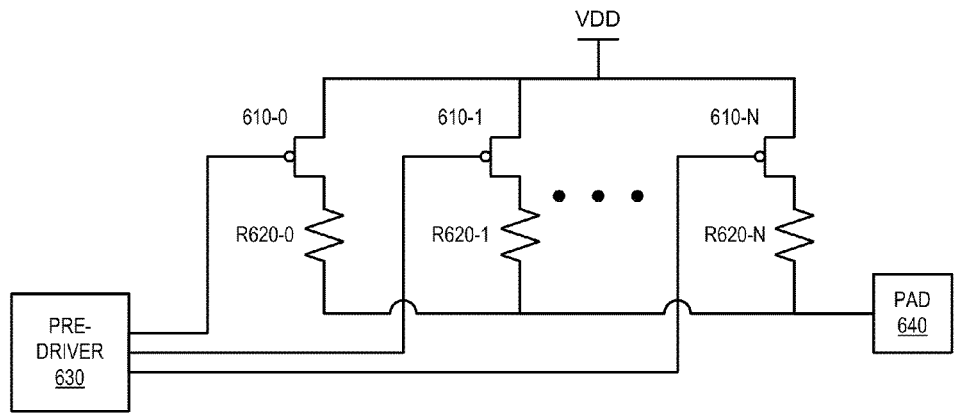
FIG. 6A is a block diagram of an embodiment of a multi-leg pull-up impedance circuit.

FIG. 6A is a block diagram of an embodiment of a multi-leg pull-up impedance circuit. In one embodiment, the output driver achieves different pull-up impedance by the use of switching in a different number of legs of a pull-up circuit or pull-up system. Pull-up circuit 602 includes N switches, 610-0 through 610-N, and a corresponding number of resistors, R620-0 through R620-N. Each combination of switch 610-$n$ and resistor R620-$n$ is a leg of pull-up circuit 602. Predriver 630 can select a number of legs to switch on to create the desired impedance. In one embodiment, each resistor is of roughly equivalent size (e.g., the same except for process variation), and desired number of resistors is turned on in parallel to give the desired impedance. In an alternative embodiment, one or more of the resistors has a different value, which can be selectively combined to adjust to a desired output impedance. It will be understood that all pull-up legs are connected in parallel to pad 640, which represents the output point for pull-up circuit 602.

Figure 6B:
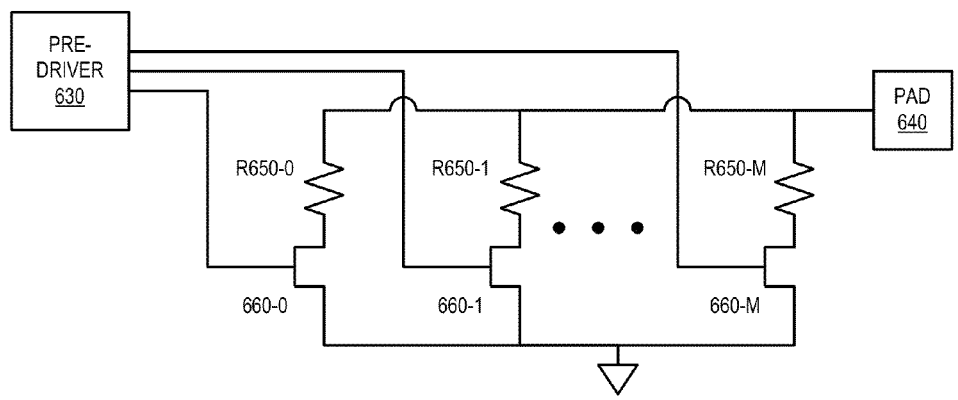
FIG. 6B is a block diagram of an embodiment of a multi-leg pull-down impedance circuit.

FIG. 6B is a block diagram of an embodiment of a multi-leg pull-down impedance circuit. In one embodiment, the output driver achieves different pull-down impedance by the use of switching in a different number of legs of a pull-down circuit or pull-down system. Pull-down circuit 604 includes M switches, 660-0 through 660-M, and a corresponding number of resistors, R650-0 through R650-M. Each combination of switch 660-$m$ and resistor R650-$n$ is a leg of pull-down circuit 604. In one embodiment, M is the same number as N. In one embodiment, there are a different number of pull-up legs and pull-down legs.

Predriver 630 can select a number of legs to switch on to create the desired impedance. In one embodiment, each resistor is of roughly equivalent size (e.g., the same except for process variation), and desired number of resistors is turned on in parallel to give the desired impedance. In an alternative embodiment, one or more of the resistors has a different value, which can be selectively combined to adjust to a desired output impedance. The individual pull-down resistors may or may not be the same value as the individual pull-up resistors. It will be understood that all pull-down legs are connected in parallel to pad 640, which represents the output point for pull-down circuit 604.

It is also understood that pull-up circuit 602 and pull-down circuit 604 are connected to pad 640. Traditional methods of achieving different impedances involved adding more legs to either or both of pull-down circuit 604 or pull-up circuit 602. However, adding more legs increases the pad capacitance (commonly referred to as PAD CAP or Cpad). Increasing the parasitic PAD CAP value can negatively affect timing and bandwidth performance. Additionally, adding more legs requires more circuitry/logic in predriver 630, which requires more power. Instead of adding more lower legs or pull-down legs, predriver 630 can selectively switch on a ratio of upper and lower legs to achieve a desired output impedance. Thus, different output impedance configurations can be achieved without increasing the number of legs in the system, which means that PAD CAP is unchanged and timing performance can be maintained.

It will be understood that the number of pull-up legs and/or pull-down legs to switch on depends on the system design, as well as a desired output impedance. A number of the pull-up legs switched on is different for a logic low and a logic high. In one embodiment, a number of pull-up legs can be turned on and left on for the entire time the driver drives the transmission line, with just the other upper legs and the lower legs being switched on and off to differentiate between a one and a zero, or a logic low and logic high. Thus, the predriver can switch on a ratio of upper and lower legs to generate an effective output impedance. In one embodiment, the ratio chosen is a ratio that causes an effective output impedance for a logic low to be the same as the effective output impedance for a logic high.

Figure 7:
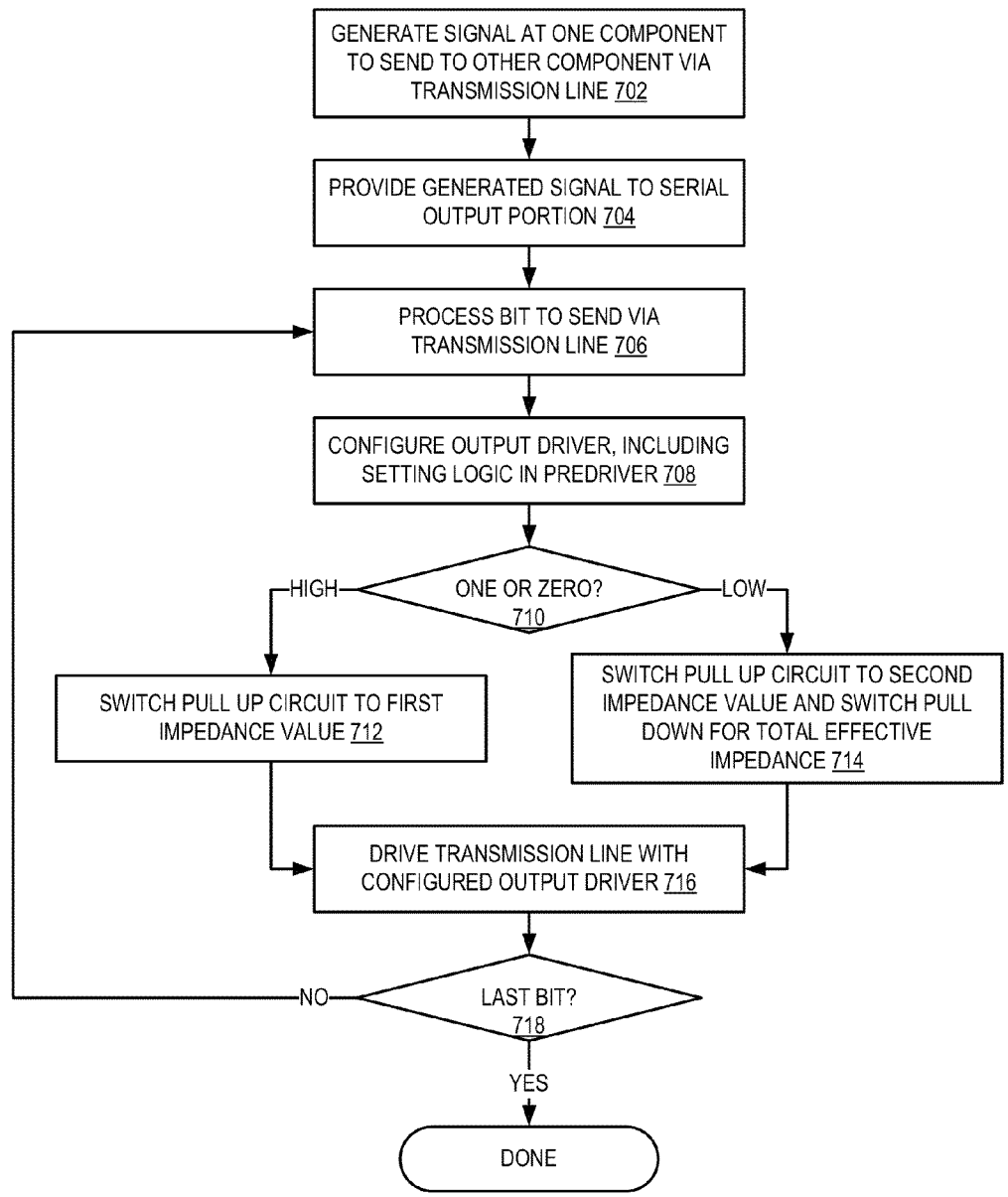
FIG. 7 is a flow diagram of an embodiment of a process for driving an output signal with an output driver having a variable output impedance configuration.

FIG. 7 is a flow diagram of an embodiment of a process for driving an output signal with an output driver having a variable output impedance configuration. In one embodiment, a component of a host platform generates a signal to send to another component via a transmission line, 702. The components interface via the transmission line. The component that has a signal to send is the transmitter for purposes of the signal exchange, and the component to which it sends the signal is the receiver for purposes of the signal exchange. In one embodiment, the transmitter provides the generated signal to its serial output portion or transceiver, 704. The output portion includes a driver to drive the signal on the transmission line. The driver drives ones and zeroes to provide the signal to the receiver.

The output portion processes the signal to determine a bit to send to the receiver via the transmission line, 706. The output portion, via a predriver and/or other logic, configures the output driver, 708. The predriver configures the output driver differently based on whether it will drive a zero or one onto the transmission line. It will be understood that it is common to output a one as a logic high, and a zero as a logic low; however, the logic could be reversed (send a logic high as a zero and a logic low as a one). If the driver is to drive a logic high, 710 HIGH branch, the predriver can switch a pull-up circuit to a first impedance value, 712. If the driver is to drive a logic low, 710 LOW branch, the predriver can switch a pull-up circuit to a second impedance value and switch on a pull-down circuit for a total effective output impedance determine at least in part by the combination of pull-up and pull-down impedance, 714. Alternatively, the HIGH branch and the LOW branch could be reversed, where the predriver would switch a pull-down circuit to a first impedance value instead of a pull-up circuit in 712.

Whether a logic high or a logic low, once the driver is configured, it can drive the transmission line as configured, 716. In one embodiment, the driver is to drive a sequence of bits, and the transceiver determines if the last bit has been sent, 718. If the last bit has been sent, YES branch, the operation for that transmission can complete. If the last bit has not been sent, NO branch, the transceiver processes the next bit, configures the output driver (e.g., leaving the configuration the same, or reconfiguring the driver), and repeats the output process.

Figure 8:
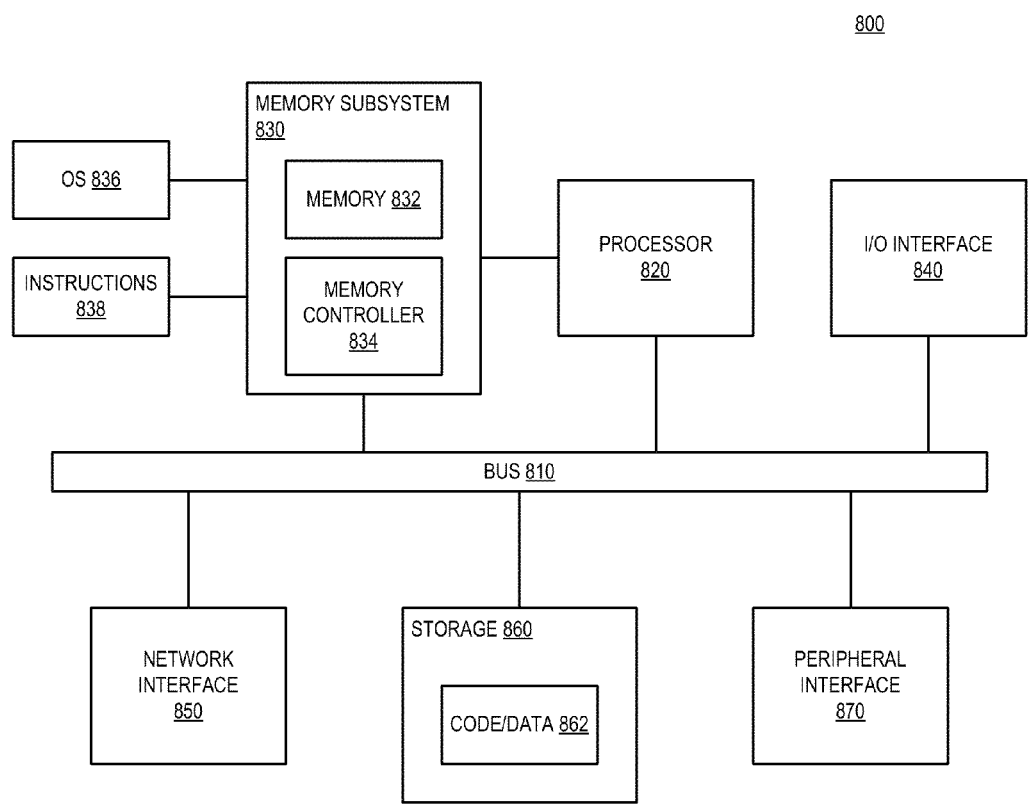
FIG. 8 is a block diagram of an embodiment of a computing system in which an output driver having a variable output impedance configuration can be implemented.

FIG. 8 is a block diagram of an embodiment of a computing system in which an output driver having a variable output impedance configuration can be implemented. System 800 represents a computing device in accordance with any embodiment described herein, and can be a laptop computer, a desktop computer, a server, a switch, a gaming or entertainment control system, a scanner, copier, printer, or other electronic device. System 800 includes processor 820, which provides processing, operation management, and execution of instructions for system 800. Processor 820 can include any type of microprocessor, central processing unit (CPU), processing core, or other processing hardware to provide processing for system 800. Processor 820 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 830 represents the main memory of system 800, and provides temporary storage for code to be executed by processor 820, or data values to be used in executing a routine. Memory subsystem 830 can include one or more memory devices such as read-only memory (ROM), flash memory, one or more varieties of random access memory (RAM), or other memory devices, or a combination of such devices. Memory subsystem 830 stores and hosts, among other things, operating system (OS) 836 to provide a software platform for execution of instructions in system 800. Additionally, other instructions 838 are stored and executed from memory subsystem 830 to provide the logic and the processing of system 800. OS 836 and instructions 838 are executed by processor 820. Memory subsystem 830 includes memory device 832 where it stores data, instructions, programs, or other items. In one embodiment, memory subsystem includes memory controller 834, which provides control over the memory resources, including performing I/O with the memory devices for memory access.

Processor 820 and memory subsystem 830 are coupled to bus/bus system 810. Bus 810 is an abstraction that represents any one or more separate physical buses, communication lines/interfaces, and/or point-to-point connections, connected by appropriate bridges, adapters, and/or controllers. Therefore, bus 810 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 810 can also correspond to interfaces in network interface 850.

System 800 also includes one or more input/output (I/O) interface(s) 840, network interface 850, one or more internal mass storage device(s) 860, and peripheral interface 870 coupled to bus 810. I/O interface 840 can include one or more interface components through which a user interacts with system 800 (e.g., video, audio, and/or alphanumeric interfacing). Network interface 850 provides system 800 the ability to communicate with remote devices (e.g., servers, other computing devices) over one or more networks. Network interface 850 can include an Ethernet adapter, wireless interconnection components, USB (universal serial bus), or other wired or wireless standards-based or proprietary interfaces.

Storage 860 can be or include any conventional medium for storing large amounts of data in a nonvolatile manner, such as one or more magnetic, solid state, or optical based disks, or a combination. Storage 860 holds code or instructions and data 862 in a persistent state (i.e., the value is retained despite interruption of power to system 800). Storage 860 can be generically considered to be a "memory," although memory 830 is the executing or operating memory to provide instructions to processor 820. Whereas storage 860 is nonvolatile, memory 830 can include volatile memory (i.e., the value or state of the data is indeterminate if power is interrupted to system 800).

Peripheral interface 870 can include any hardware interface not specifically mentioned above. Peripherals refer generally to devices that connect dependently to system 800. A dependent connection is one where system 800 provides the software and/or hardware platform on which operation executes, and with which a user interacts.

In one embodiment, any of the components within system 800 that can engage in I/O with other components, based on system architecture and configuration, can perform the I/O with an output driver having a variable output impedance in accordance with any embodiment herein. The output driver outputs a logic value in accordance with a combination of upper and lower output legs to lower output swing.

Figure 9:
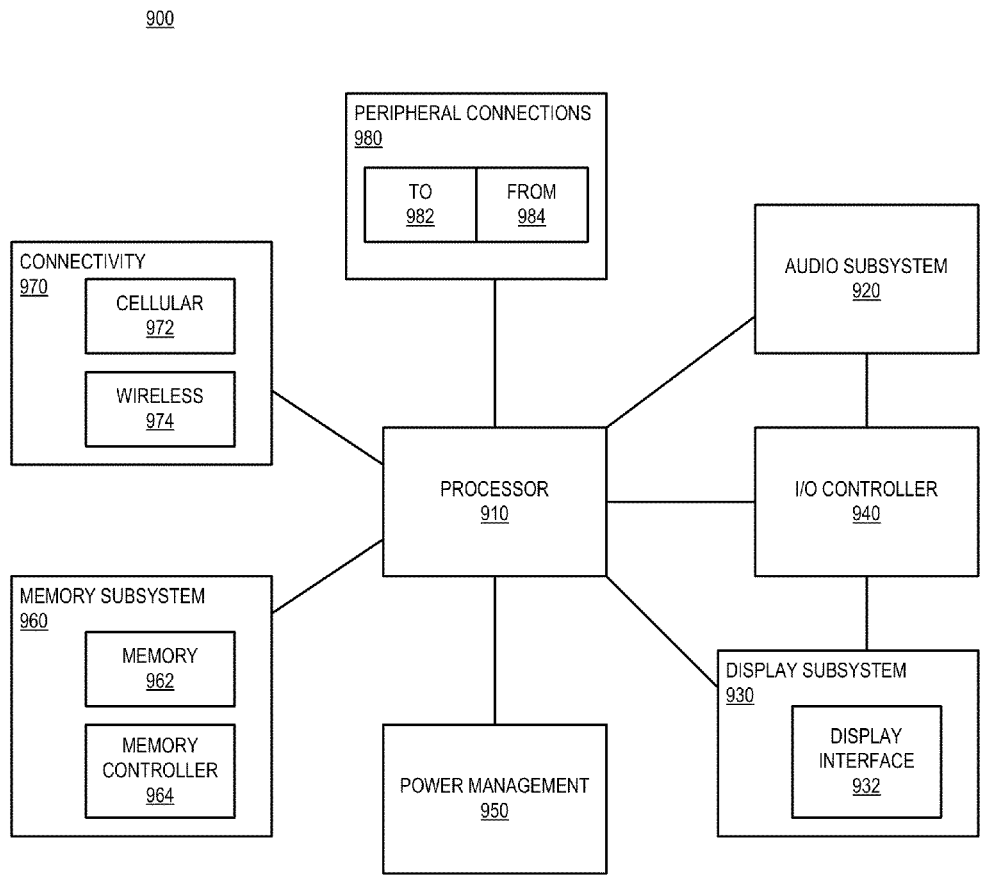
FIG. 9 is a block diagram of an embodiment of a mobile device which an output driver having a variable output impedance configuration can be implemented.

FIG. 9 is a block diagram of an embodiment of a mobile device which an output driver having a variable output impedance configuration can be implemented. Device 900 represents a mobile computing device, such as a computing tablet, a mobile phone or smartphone, a wireless-enabled e-reader, or other mobile device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. In one embodiment, processor 910 includes optical interface components in addition to a processor die. Thus, the processor die and photonic components are in the same package. Such a processor package can interface optically with an optical connector in accordance with any embodiment described herein.

The processing operations performed by processor 910 include the execution of an operating platform or operating system on which applications and/or device functions are executed. The processing operations include operations related to I/O (input/output) with a human user or with other devices, operations related to power management, and/or operations related to connecting device 900 to another device. The processing operations can also include operations related to audio I/O and/or display I/O.

In one embodiment, device 900 includes audio subsystem 920, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software (e.g., drivers) components that provide a visual and/or tactile display for a user to interact with the computing device. Display subsystem 930 includes display interface 932, which includes the particular screen or hardware device used to provide a display to a user. In one embodiment, display interface 932 includes logic separate from processor 910 to perform at least some processing related to the display. In embodiment, display subsystem 930 includes a touchscreen device that provides both output and input to a user.

I/O controller 940 represents hardware devices and software components related to interaction with a user. I/O controller 940 can operate to manage hardware that is part of audio subsystem 920 and/or display subsystem 930. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 and/or display subsystem 930. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Memory subsystem 960 includes memory device(s) 962 for storing information in device 900. Memory subsystem 960 can include nonvolatile (state does not change if power to the memory device is interrupted) and/or volatile (state is indeterminate if power to the memory device is interrupted) memory devices. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 provides control over the memory resources, including performing I/O with the memory devices for memory access.

Connectivity 970 includes hardware devices (e.g., wireless and/or wired connectors and communication hardware) and software components (e.g., drivers, protocol stacks) to enable device 900 to communicate with external devices. The device could be separate devices, such as other computing devices, wireless access points or base stations, as well as peripherals such as headsets, printers, or other devices.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading and/or uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, any of the components within system 900 that can engage in I/O with other components, based on system architecture and configuration, can perform the I/O with an output driver having a variable output impedance in accordance with any embodiment herein. The output driver outputs a logic value in accordance with a combination of upper and lower output legs to lower output swing.

In one aspect, an output driver includes a pull-up circuit including a variable pull-up resistor to pull up a transmission line driven by the output driver; a pull-down circuit including a pull-down resistor to pull down the transmission line; and driver control logic coupled to the pull-up circuit and the pull-down circuit, configured to switch on the pull-up circuit to a first value of impedance to drive a logic high on the transmission line, and configured to switch on the pull-up circuit to a second value of impedance and to switch on the pull-down circuit to drive a logic low on the transmission line, where the second value of impedance in parallel with impedance of the pull-down circuit provides an effective output impedance for the output driver when driving the logic low.

In one embodiment, the pull-up circuit includes multiple legs, each leg including a switching transistor and a resistor element, wherein the variable pull-up resistor is generated by switching on a number of the multiple legs to result in a desired impedance. In one embodiment, the pull-down circuit includes multiple legs, each leg including a switching transistor and a resistor element, wherein an impedance of the pull-down circuit is adjustable based on switching on a number of the multiple legs. In one embodiment, the driver control logic comprises driver pre-equalization logic. In one embodiment, the pull-up circuit includes multiple legs, and the pull-down circuit includes multiple legs, where the driver control logic is configured to switch on a ratio of pull-up and pull-down legs to generate the effective output impedance. In one embodiment, the ratio of pull-up and pull-down legs generates an effective output impedance approximately equal to the first value of impedance. In one embodiment, the output driver further includes reference voltage logic to adjust a center reference voltage (Vref) to reduce a voltage swing on the transmission line.

In one aspect, an electronic device includes an output driver in a memory subsystem to exchange signals between components of the memory subsystem, the output driver including a pull-up circuit including a variable pull-up resistor to pull up a transmission line driven by the output driver; a pull-down circuit including a pull-down resistor to pull down the transmission line; and driver control logic coupled to the pull-up circuit and the pull-down circuit, configured to switch on the pull-up circuit to a first value of impedance to drive a logic high on the transmission line, and configured to switch on the pull-up circuit to a second value of impedance and to switch on the pull-down circuit to drive a logic low on the transmission line, where the second value of impedance in parallel with impedance of the pull-down circuit provides an effective output impedance for the output driver when driving the logic low; and a touchscreen display device configured to provide a user display based on data accessed by the memory subsystem.

In one embodiment, the pull-up circuit includes multiple legs, each leg including a switching transistor and a resistor element, wherein the variable pull-up resistor is generated by switching on a number of the multiple legs to result in a desired impedance. In one embodiment, the pull-down circuit includes multiple legs, each leg including a switching transistor and a resistor element, wherein an impedance of the pull-down circuit is adjustable based on switching on a number of the multiple legs. In one embodiment, the driver control logic comprises driver pre-equalization logic. In one embodiment, the pull-up circuit includes multiple legs, and the pull-down circuit includes multiple legs, where the driver control logic is configured to switch on a ratio of pull-up and pull-down legs to generate the effective output impedance. In one embodiment, the ratio of pull-up and pull-down legs generates an effective output impedance approximately equal to the first value of impedance. In one embodiment, the output driver further includes reference voltage logic to adjust a center reference voltage (Vref) to reduce a voltage swing on the transmission line.

In one aspect, a method includes receiving an input signal to output with an output driver on a transmission line driven by the output driver; configuring the output driver to drive the transmission line in accordance with the input signal, including, for a logic high, switching on a pull-up circuit of the output driver with driver control logic to a first value of impedance; and for a logic low, switching on the pull-up circuit to a second value of impedance and switching on the pull-down circuit, where the second value of impedance in parallel with impedance of the pull-down circuit provides an effective output impedance for the output driver; and driving the transmission line with the configured output driver.

In one embodiment, the pull-up circuit includes multiple legs, each leg including a switching transistor and a resistor element, wherein an impedance of the pull-up circuit is adjustable based on switching on a number of the multiple legs. In one embodiment, the pull-down circuit includes multiple legs, each leg including a switching transistor and a resistor element, wherein an impedance of the pull-down circuit is adjustable based on switching on a number of the multiple legs. In one embodiment, configuring the output driver comprises configuring the output driver with pre-equalization logic coupled to the output driver. In one embodiment, the pull-up circuit includes multiple legs, and the pull-down circuit includes multiple legs, where configuring the output driver comprises switching on a ratio of pull-up and pull-down legs to generate the effective output impedance. In one embodiment, the ratio of pull-up and pull-down legs generates an effective output impedance approximately equal to the first value of impedance. In one embodiment, the method further includes adjusting a center reference voltage (Vref) to reduce a voltage swing on the transmission line.

In one aspect, a method includes receiving an input signal to output with an output driver on a transmission line driven by the output driver; configuring the output driver to drive the transmission line in accordance with the input signal, including, for a logic low, switching on a pull-down circuit of the output driver with driver control logic to a first value of impedance; and for a logic high, switching on the pull-down circuit to a second value of impedance and switching on a pull-up circuit, where the second value of impedance in parallel with impedance of the pull-up circuit provides an effective output impedance for the output driver; and driving the transmission line with the configured output driver.

In one embodiment, the pull-down circuit includes multiple legs, each leg including a switching transistor and a resistor element, wherein an impedance of the pull-down circuit is adjustable based on switching on a number of the multiple legs. In one embodiment, the pull-up circuit includes multiple legs, each leg including a switching transistor and a resistor element, wherein an impedance of the pull-up circuit is adjustable based on switching on a number of the multiple legs. In one embodiment, configuring the output driver comprises configuring the output driver with pre-equalization logic coupled to the output driver. In one embodiment, the pull-down circuit includes multiple legs, and the pull-up circuit includes multiple legs, where configuring the output driver comprises switching on a ratio of pull-up and pull-down legs to generate the effective output impedance.

Flow diagrams as illustrated herein provide examples of sequences of various process actions. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An output driver comprising:
    a pull-up circuit including a variable pull-up resistor to pull up a transmission line driven by the output driver;
    a pull-down circuit including a pull-down resistor to pull down the transmission line; and
    driver control logic coupled to the pull-up circuit and the pull-down circuit, the driver control logic to establish a first value of impedance of the pull-up circuit to drive a logic high on the transmission line, the driver control logic to establish a second value of impedance of the pull-up circuit and to switch on the pull-down circuit to drive a logic low on the transmission line, where the second value of impedance of the pull-up circuit in parallel with an impedance of the pull-down circuit provides an effective output impedance for the output driver when driving the logic low; and,
    reference voltage logic to adjust a center reference voltage (Vref) to reduce a voltage swing on the transmission line.

2. The output driver of claim 1, wherein the pull-up circuit includes multiple legs, each leg including a switching transistor and a resistor element, wherein the variable pull-up resistor is generated by switching on a number of the multiple legs to result in a desired impedance.

3. The output driver of claim 1, wherein the pull-down circuit includes multiple legs, each leg including a switching transistor and a resistor element, wherein an impedance of the pull-down circuit is adjustable based on switching on a number of the multiple legs.

4. The output driver of claim 1, wherein the driver control logic comprises driver pre-equalization logic.

5. The output driver of claim 1, wherein the pull-up circuit includes multiple legs, and the pull-down circuit includes multiple legs, where the driver control logic is to switch on a ratio of pull-up and pull-down legs to generate the effective output impedance.

6. The output driver of claim 5, wherein the ratio of pull-up and pull-down legs generates an effective output impedance approximately equal to the first value of impedance.

7. An electronic device comprising:
    a) an output driver in a memory subsystem to exchange signals between components of the memory subsystem, the output driver including:
        (i) a pull-up circuit including a variable pull-up resistor to pull up a transmission line driven by the output driver;
        (ii) a pull-down circuit including a pull-down resistor to pull down the transmission line; and
        (iii) driver control logic coupled to the pull-up circuit and the pull-down circuit, the driver control logic to establish a first value of impedance of the pull-up circuit to drive a logic high on the transmission line, the driver control logic to establish a second value of impedance of the pull-up circuit and to switch on the pull-down circuit to drive a logic low on the transmission line, where the second value of impedance of the pull-up circuit in parallel with an impedance of the pull-down circuit provides an effective output impedance for the output driver when driving the logic low;
        (iv) reference voltage logic to adjust a center reference voltage (Vref) to reduce a voltage swing on the transmission line; and,
    b) a touchscreen display device configured to provide a user display based on data accessed by the memory subsystem.

8. The electronic device of claim 7, wherein the pull-up circuit includes multiple legs, each leg including a switching transistor and a resistor element, wherein the variable pull-up resistor is generated by switching on a number of the multiple legs to result in a desired impedance.

9. The electronic device of claim 7, wherein the pull-down circuit includes multiple legs, each leg including a switching transistor and a resistor element, wherein an impedance of the pull-down circuit is adjustable based on switching on a number of the multiple legs.

10. The electronic device of claim 7, wherein the driver control logic comprises driver pre-equalization logic.

11. The electronic device of claim 7, wherein the pull-up circuit includes multiple legs, and the pull-down circuit includes multiple legs, where the driver control logic is to switch on a ratio of pull-up and pull-down legs to generate the effective output impedance.

12. The electronic device of claim 11, wherein the ratio of pull-up and pull-down legs generates an effective output impedance approximately equal to the first value of impedance.

13. A method comprising:
  receiving an input signal to output with an output driver on a transmission line driven by the output driver;
  configuring the output driver to drive the transmission line in accordance with the input signal, including,
    for a logic high, switching on a pull-up circuit of the output driver with driver control logic to a first value of impedance; and
    for a logic low, switching on the pull-up circuit to a second value of impedance and switching on the pull-down circuit, where the second value of impedance in parallel with impedance of the pull-down circuit provides an effective output impedance for the output driver;
    adjusting a center reference voltage (Vref) to reduce a voltage swing on the transmission line; and,
  driving the transmission line with the configured output driver.

14. The method of claim 13, wherein the pull-up circuit includes multiple legs, each leg including a switching transistor and a resistor element, wherein an impedance of the pull-up circuit is adjustable based on switching on a number of the multiple legs.

15. The method of claim 13, wherein the pull-down circuit includes multiple legs, each leg including a switching transistor and a resistor element, wherein an impedance of the pull-down circuit is adjustable based on switching on a number of the multiple legs.

16. The method of claim 13, wherein configuring the output driver comprises configuring the output driver with pre-equalization logic coupled to the output driver.

17. The method of claim 13, wherein the pull-up circuit includes multiple legs, and the pull-down circuit includes multiple legs, where configuring the output driver comprises switching on a ratio of pull-up and pull-down legs to generate the effective output impedance.

18. The method of claim 17, wherein the ratio of pull-up and pull-down legs generates an effective output impedance approximately equal to the first value of impedance.

19. A method comprising:
  receiving an input signal to output with an output driver on a transmission line driven by the output driver;
  configuring the output driver to drive the transmission line in accordance with the input signal, including,
    for a logic low, switching on a pull-down circuit of the output driver with driver control logic to a first value of impedance; and
    for a logic high, switching on the pull-down circuit to a second value of impedance and switching on a pull-up circuit, where the second value of impedance in parallel with impedance of the pull-up circuit provides an effective output impedance for the output driver;
    adjusting a center reference voltage (Vref) to reduce a voltage swing on the transmission line; and
  driving the transmission line with the configured output driver.

20. The method of claim 19, wherein the pull-down circuit includes multiple legs, each leg including a switching transistor and a resistor element, wherein an impedance of the pull-down circuit is adjustable based on switching on a number of the multiple legs.

21. The method of claim 19, wherein the pull-up circuit includes multiple legs, each leg including a switching transistor and a resistor element, wherein an impedance of the pull-up circuit is adjustable based on switching on a number of the multiple legs.

22. The method of claim 19, wherein configuring the output driver comprises configuring the output driver with pre-equalization logic coupled to the output driver.

23. The method of claim 19, wherein the pull-down circuit includes multiple legs, and the pull-up circuit includes multiple legs, where configuring the output driver comprises switching on a ratio of pull-up and pull-down legs to generate the effective output impedance.

* * * * *